United States Patent [19]

Jain et al.

[11] Patent Number: 4,458,994
[45] Date of Patent: Jul. 10, 1984

[54] HIGH RESOLUTION OPTICAL LITHOGRAPHY METHOD AND APPARATUS HAVING EXCIMER LASER LIGHT SOURCE AND STIMULATED RAMAN SHIFTING

[75] Inventors: Kantilal Jain; Carlton G. Willson, both of San Jose, Calif.

[73] Assignee: International Business Machines Corporation, Armonk, N.Y.

[21] Appl. No.: 502,044

[22] Filed: Jun. 7, 1983

Related U.S. Application Data

[63] Continuation of Ser. No. 268,511, May 29, 1981, abandoned.

[51] Int. Cl.$^3$ .............................................. G03B 41/00
[52] U.S. Cl. ........................................................ 354/4
[58] Field of Search ........................ 354/4, 5; 307/426

[56] References Cited

U.S. PATENT DOCUMENTS

| | | | |
|---|---|---|---|
| 4,063,192 | 12/1977 | Bhaumik et al. | 331/94.5 G |
| 4,117,177 | 9/1978 | Schlafer | 427/53 |
| 4,144,464 | 3/1979 | Loree et al. | 307/426 |
| 4,194,170 | 3/1980 | Kurnit | 331/94.5 W |
| 4,195,930 | 4/1980 | Delhaye et al. | 356/301 |
| 4,243,881 | 1/1981 | Bethune | 307/426 X |
| 4,251,625 | 2/1981 | Sakamoto et al. | 354/4 X |

OTHER PUBLICATIONS

"Laser Projection Printing", M. Brevignon et al., *Solid State Technology*, Aug. 1980, pp. 115-121.
"Excemer Lasers", from *High-Power Lasers & Applications*, Eds. K. L. Kompa & H. Walther, Springer, 1978, pp. 3-8.
"Coherent Radiation Generation at Short Wavelengths", D. J. Bradley, from *High Power Lasers & Applications*, Eds. K. L. Kompa & H. Walther, Springer, 1978, pp. 9-18.

*Primary Examiner*—Michael L. Gellner
*Attorney, Agent, or Firm*—Otto Schmid, Jr.

[57] ABSTRACT

An optical lithography method and apparatus in which a pulsed excimer laser produces at least one fundamental output which is directed to expose a photosensitive medium. The output is highly non-gaussian and has sufficient power so that full exposures can be accomplished within a few seconds. An alternate light source is provided by directing the excimer laser output to a Raman cell having a suitable Raman medium contained therein. At least one secondary wavelength is produced by stimulated Raman scattering and the output of the Raman cell is directed to expose a photosensitive medium. A mixture of more than one excimer gas can also be provided in the excimer laser to produce one fundamental output for each excimer gas present in the mixture. These outputs can be directed to expose a photosensitive medium directly. Alternatively, these outputs can be directed to a Raman cell having either a single Raman medium or multiple Raman media in a suitable mixture and directing the output from the Raman cell to expose the photosensitive medium.

50 Claims, 11 Drawing Figures

HIGH RESOLUTION OPTICAL LITHOGRAPHY METHOD AND APPARATUS HAVING EXCIMER LASER LIGHT SOURCE AND STIMULATED RAMAN SHIFTING

This is a continuation of application Ser. No. 268,511 filed May 29, 1981, now abandoned.

BACKGROUND OF THE INVENTION

This invention relates to an improved optical lithography method and apparatus and, more particularly, to an optical lithography method and apparatus having a pulsed laser light source and stimulated raman shifting to produce single or multiple wavelength exposure of a photosensitive element at high resolution.

The drive toward higher density circuitry in microelectronic devices has promoted interest in a variety of high resolution lithographic techniques which require the ability to produce finer resolution patterns at high production rates. In optical lithography, the improvement in resolution that results by use of shorter wavelengths is well known. As a result of these considerations, an effort has been made to develop processes and materials which require exposure in the deep UV spectral region. The light source traditionally used in these prior art systems has been either a deuterium lamp or a xenon-mercury arc lamp. The problem with using such lamps is that insufficient power is available from them in the desired spectral region. For a typical lamp in a typical system, the total deep UV power that can be collected for use is in the few tens of milliwatts range, so that the exposure time for resists that are sensitive in the deep UV are typically several minutes.

It is known that lasers generally produce an intense output, and lasers are known in the prior art which produce outputs in the deep UV spectral region. However, the use of lasers in projection photolithography has traditionally been considered unattractive due to the spatial and temporal coherence characteristics of most lasers. When a field of dimension larger than a few wavelengths is illuminated by a Gaussian beam through some optical components, different parts of the original wavefront interfere constructively and destructively at the sample surface due to imperfections in the various optical surfaces at which the laser beam is reflected or refracted. This interference produces a random pattern called speckle. The presence of speckle completely rules out image formation with feature sizes at the micrometer or submicrometer level, so this characteristic eliminates the use of lasers in projection systems. For this reason, the use of lasers in prior art pattern writing has been in the scanning spot mode, where the beam is focused on the sample and suitably deflected to directly write the desired pattern on the substrate. It will be recognized that this mode of operation requires a CW (continuous wave) laser output and additional high precision deflection mechanisms, and the resultant exposure times are still much longer than desirable.

Another problem that was encountered in prior art photolithography systems is the fact that many otherwise good photoresist materials have been considered undesirable simply because the peak of their spectral performance does not match in wavelength with the emission lines available from the various conventional lamps. As a result of this problem, a considerable amount of development work has been, and continues to be, conducted in an attempt to shift the peak sensitivity region for the photoresist materials to a wavelength at which a suitable emission line is available from the conventional lamp sources.

A further problem that was encountered in the prior art relates to the standing waves produced due to interference between the incident radiation and that reflected from the substrate and from the photosensitive medium-air interface. These standing waves reduce the edge definition of the pattern and limit the effective resolution.

SUMMARY OF THE INVENTION

It is, therefore, the principal object of this invention to provide an optical lithography method and apparatus having an improved light source capable of producing uniform exposure of a pattern at very fine resolution in an exposure time substantially faster than prior art systems.

It is another object of this invention to provide an optical lithography method and apparatus having an improved light source capable of producing output at a plurality of separate wavelengths.

It is a further object of this invention to provide an optical lithography method and apparatus having an improved light source capable of producing output wavelengths selected to produce optimized exposure for a given photosensitive element.

Briefly, according to the invention, there is provided an optical lithography method and apparatus in which a pulsed excimer laser produces an output including at least one fundamental or primary output with each fundamental output at a predetermined wavelength, and means for directing the output to expose a photosensitive medium to produce a pattern.

According to another feature of the invention, the light source for the optical lithography apparatus may also include means for directing the output of the pulsed excimer laser to produce at least one secondary wavelength output by stimulated Raman scattering in a suitable medium contained in a Raman cell, and means for directing the output of the Raman cell to expose a photosensitive medium to produce a pattern.

Our method and apparatus has the advantage of providing high resolution exposure by a pulsed laser source which has sufficient power to require very short exposure times in the range of a few seconds which, in the deep UV region, represents an improvement by about two orders of magnitude over a conventional mercury lamp.

Another advantage of our method and apparatus is that, in contrast to prior art systems, the excimer laser can be used in both the contact (including proximity) exposure mode and the projection exposure mode (including full-wafer scanning and step-and-repeat systems). The factor that makes the excimer laser usable in these systems without producing speckle is the fact that the mode structure of an excimer laser beam is not a spatially coherent single transverse mode. Instead, the beam is highly multi-mode, and can be thought of as a random superposition of a large number of independent Gaussian beams.

A further advantage of our method and apparatus is that the output wavelengths can be shifted as desired by selection of the excimer and by the stimulated Raman scattering which can be used to produce one or more wavelengths in a desired spectral region. Therefore, the exposure wavelength can be optimized for the photosensitive medium, rather than the other way around.

DESCRIPTION OF THE PREFERRED EMBODIMENTS

Figure 1:
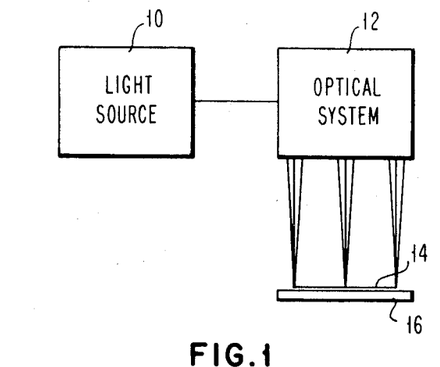
FIG. 1 is a schematic diagrammatic view of a contact or proximity optical lithography system embodying the invention.

The contact or proximity optical lithography apparatus shown schematically in FIG. 1 comprises a suitable light source 10 which produces light of suitable wavelength and intensity and a suitable optical system 12 positioned to receive the light from source 10, transform the light to the desired configuration, and to direct the light through a suitable mask member 14 to expose a photosensitive element 16. The optical system 12 includes a condensing element and optical means to direct the beam and to make the beam uniform over the area of mask member 14. The design of such optical systems 12 is well-known in the prior art so the optical system will not be described in any greater detail here. The mask member 14 comprises a pattern of contrast elements (opaque and transparent regions, for example) that define the pattern to be reproduced. Mask member 14 is held either in contact with photosensitive element 16 or is spaced apart in close proximity by a well-controlled gap which is typically a few micrometers. Photosensitive element 16 comprises material which is sensitive to the wavelength of light from light source 10 to produce an image of the mask member pattern where exposed. In a particular embodiment of our invention, photosensitive element 16 comprises a semiconductor wafer on which a thin coating of a photosensitive resist is added. Exposure of the resist and subsequent processing is utilized to produce predetermined patterns by processing the semiconductor wafer to generate desired semiconductor devices.

Figure 2:
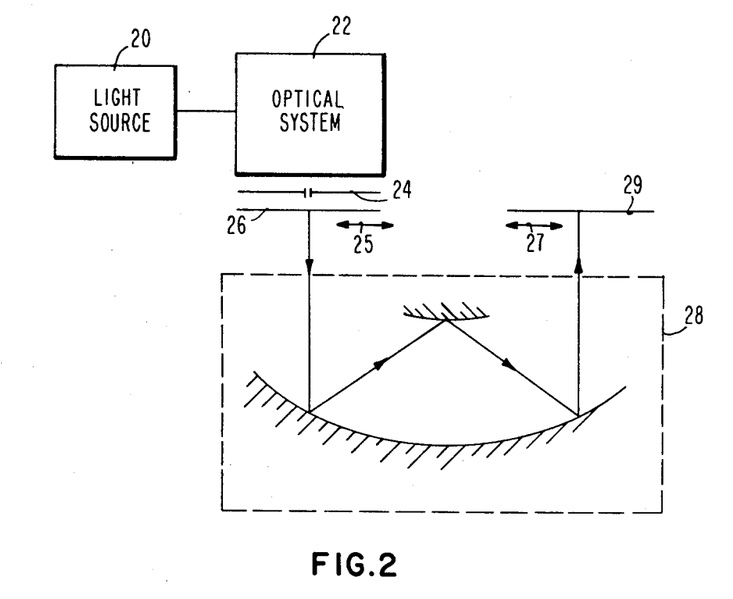
FIG. 2 is a schematic diagrammatic view of a projection optical lithography system embodying the invention.

The projection embodiment of the optical lithography system shown in FIG. 2 comprises a suitable light source 20 whose function is to provide light of suitable wavelength and intensity. Optical system 22 functions to receive the light and, utilizing suitable condensing elements and optical elements, to uniformly illuminate the field encompassed by slit exposure member 24. Light from slit exposure is directed through mask member 26 to projection optical means 28. Projection optical means 28 is designed to direct light from slit exposure member 24 which has passed through mask member 26 to a corresponding point on photosensitive element 29. Mask member 26 and photosensitive element 29 are moved in synchronism (by means not shown) as shown by arrows 25, 27 as the successive areas are exposed. Projection optical means 28, in the embodiment shown, comprises a reflective system, but it will be recognized by those skilled in the art that the projection optical system could as well be a refractive system or a system which includes both reflective and refractive optical elements.

Figure 3:
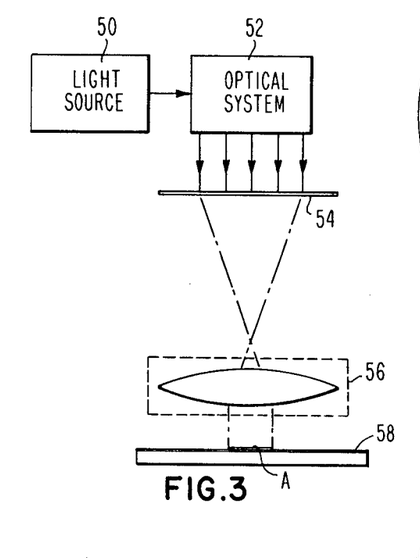
FIG. 3 is a schematic diagrammatic view of a step-and-repeat projection optical lithography system embodying the invention.
Figure 4:
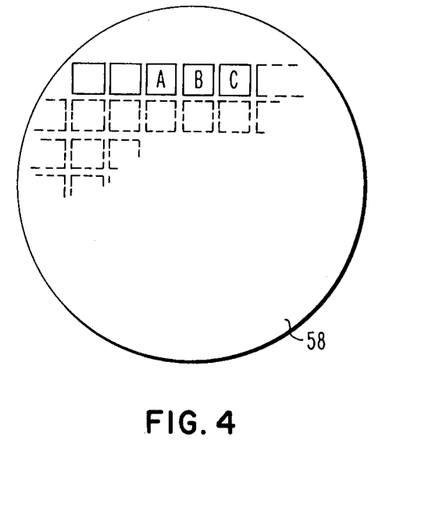
FIG. 4 is a plan view of the photosensitive element exposed by the apparatus of FIG. 3.

An alternate embodiment of a projection optical lithography system is shown in FIG. 3. This system comprises a suitable light source 50 whose function is to provide light of suitable wavelength and intensity. Light from source 50 is directed to optical system 52 which utilizes suitable condensing elements and other optical elements to uniformly illuminate the field encompassed by mask member 54. The design of optical system 52 is well known in the prior art, so this optical system will not be described in any greater detail here. Light from optical system 52 is directed through mask member 54 to projection optical means 56. Projection optical means 56 is designed to produce an image (usually reduced in magnification) of mask member 54 on photosensitive element 58 in exposure area A. In a specific embodiment, photosensitive element 58 comprises a semiconductor wafer on which a thin coating of photosensitive resist is added. Suitable semiconductor materials include silicon, gallium arsenide, and garnets, such as gadolinium gallium garnet. After exposure of area A, relative motion is produced (by known means, not shown) between mask member 56 and photosensitive element 58 to move another area of element 58 into position for exposure. Succeeding exposures are made to produce exposure areas B, C, . . . on photosensitive element 58 in a step-and-repeat manner, as shown in FIG. 4, to eventually cover the entire element 58.

For projection lithographic systems utilizing refractive optical elements, the excimer laser light source derives an additional advantage from its narrow bandwidth. This factor makes it simpler to correct for chromatic aberrations in the design of refractive optical elements in the projection lithographic systems. This advantage is especially significant for the design of refractive optical elements at short wavelengths where only a limited number of transparent optical materials with differing refractive indices, as required for correction of chromatic abberrations, are available.

Figure 5:
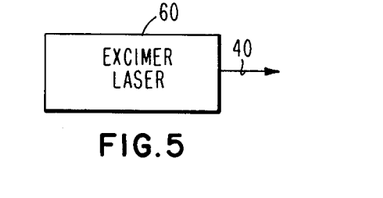
FIG. 5 is a diagrammatic view of a first embodiment of the light source for the systems of FIGS. 1, 2, and 3.

According to one embodiment of our invention, the light source 10 in FIG. 1, 20 in FIG. 2, and 50 in FIG. 3, comprises excimer laser means 60 (FIG. 5) which is a class of very efficient and powerful pulsed lasers that have only recently become commercially available. The excimer lasers emit several characteristic wavelengths from below 200 nm to above 400 nm, depending on the laser medium, and some of these are listed in Table I.

TABLE I

| Representative Excimer Laser Transitions | | | | | | |
|---|---|---|---|---|---|---|
| Lasing Medium | ArF | KrCl | KrF | XeBr | XeCl | XeF |
| Wavelength (nm) | 193 | 222 | 249 | 282 | 308 | 351 |

Figure 7:
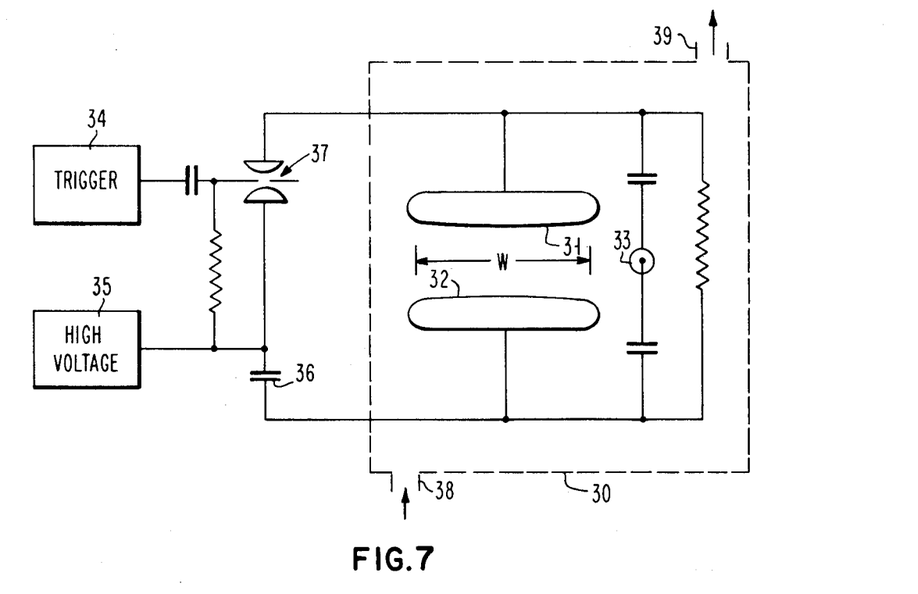
FIG. 7 is a diagrammatic cross-section view of the excimer laser light source for the systems of FIGS. 1, 2, and 3.

One embodiment of an excimer laser is shown in FIG. 7 which comprises a laser chamber 30 defined by a suitable envelope (shown by dashed line in the drawing) which confines a suitable pressurized gaseous lasing medium. This lasing medium may be one of those excimers shown in Table I, and this medium can be selected to provide the desired output wavelength to which the photosensitive element to be used is sensitive. A reservoir (not shown) is normally provided to hold a quantity of the excimer gas. Also provided is a means (not shown) to circulate the gas to gas input pipe 38, maintain the required gas pressure within laser chamber 30, and exhaust the gas at gas outlet pipe 39 for return to the reservoir. Fixed within the laser chamber are spaced-apart main electrodes 31, 32 and a preionizing spark gap 33 which is connected in parallel with the main electrodes. The output from a high voltage source 35 is coupled to charge storage capacitor 36 to a high voltage level. Capacitor 36 is coupled between main electrode 32 and one terminal of spark gap 37. The other terminal of spark gap 37 is connected to main electrode 31. Trigger circuit 34 is utilized to control the operation of the excimer laser by producing a trigger pulse at the time the laser is to be turned ON. The trigger pulse is coupled to the trigger electrode of spark gap 37, and the trigger pulse is of sufficient amplitude to cause breakdown in spark gap 37. The breakdown of spark gap 37 completes the circuit which includes the storage capacitor 36, the main electrodes 31, 32, and the preionizing spark gap 33 in parallel. This causes the gap across main electrodes and the preionizing gap to break down. The breakdown of the main gap produces emission at the wavelength determined by the selected excimer medium, and the preionizing spark helps to make the emission more uniform.

Figure 9:
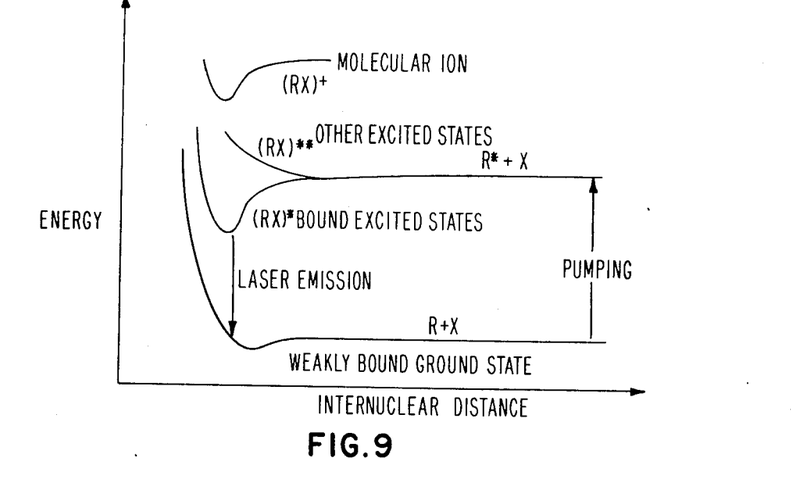
FIG. 9 is a plot showing typical potential energy curves for rare gas monohalide molecules and the various states in the operation of an excimer laser.

A brief explanation of the operation of the excimer laser light source will now be given in conjunction with the potential energy diagrams shown in FIG. 9.

The large family of molecules known as excimers are characterized by a bound excited state and an unstable or very weakly bound ground state. A subset of excimer lasers, known as rare gas halide (RGH) lasers, will be used as an example in explaining the operation of an excimer laser. The RGH lasers lase on transitions of molecules of the type RX, where R and X denote a rare gas atom and a halogen atom, respectively. Typical potential energy curves for an RGH molecule are shown in FIG. 9. Population inversion is readily produced because the lower level dissociation time ($\sim 10^{-12}$ sec) is much less than the upper level radiative lifetime ($10^{-9} - 10^{-6}$ sec). The excitation to the upper state (RX)* can be produced by several mechanisms. Since the excited state is the same as the ion pair $R^+X^-$, recombination of the positive rare gas ion and the negative halogen ion populates the upper level. The positive and negative ions are readily produced by high-energy electron collisions. Alternatively, an excited rare gas atom (R*) can directly react with a halogen molecule. Yet another way of producing the upper laser state is a reaction between R* and a halogen compound, e.g., $NF_3$.

Several different approaches have been used to pump excimer lasers. Four of the most commonly used schemes are: (a) direct excitation by a high-energy electron beam, (b) excitation by an electric discharge which is controlled by an electron beam, (c) direct electric-discharge excitation, and (d) optical pumping. Of these, the direct electric discharge is the most practical in terms of compactness and ease of operation, and this is the embodiment shown in FIG. 7. The output beam of width W is in the direction out of the paper, as shown in FIG. 7, aligned with the main electrodes.

Excimer lasers can produce an average power of several watts at a number of wavelengths. With discharge-pumped systems, the obtainable pulsewidths are typically $\sim 10-100$ ns. Thus, the peak powers are on the order of $\sim 10^7$ W. For systems with average power in the several-watt range, the available repetition rates vary from single pulse to <1 kHz. The high brightness of the excimer laser light source can either be used to obtain extremely fast exposures, as was stated above, or one can use significantly smaller numerical apertures (NA) in the projection optical means of the lithographic system and still maintain reasonable exposure times. A smaller NA results in a larger depth of field, which increases quadratically with the inverse of NA. A larger depth of field permits larger tolerances in wafer distortion and focus which leads to better lithographic patterns.

The high power output and the directionality of the excimer laser light source also permits adjustment of the NA of the condenser optics in the lithographic system. This enables one to optimize the modulation transfer function (MTF) of the system and thus produce image patterns with the desired wall profiles in the photoresist. Both of these optimization techniques result in increased device yield in semiconductor integrated circuit fabrication.

Figure 10:
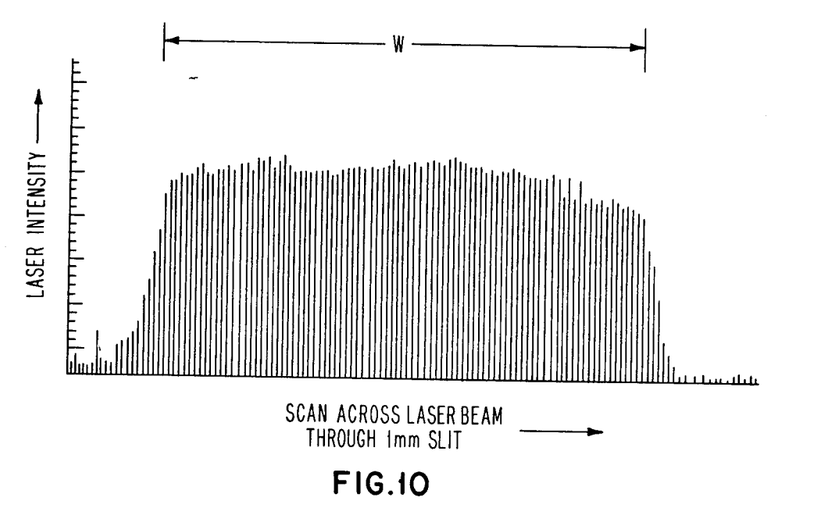
FIG. 10 is a plot showing the image intensity across the beam of the excimer laser shown in FIG. 3.

The excimer laser output cross-section depends upon the electrode geometry, and thus can be optimized over a wide range, depending upon the application. Commercial units are available which have various rectangular beam shapes, e.g., 7 mm $\times$ 20 mm and 25 mm $\times$ 30 mm. The intensity uniformity across a major portion W of the beam is excellent, as shown in FIG. 10. This uniformity arises because the mode structure of these transversely excited beams is extremely non-Gaussian; in fact, it is so highly multi-mode and random that, as was stated above, interference effects due to spatial coherence in a transverse plane were nonexistent in our optical lithography apparatus. The wide, uniform beam of the excimer laser, as contrasted to the extremely narrow and Gaussian (single transverse mode) beam of most other lasers, enables the former system to be used to produce speckle-free patterns in either a contact lithographic system or a projection lithographic system.

The excimer gas selected for use in the excimer laser may comprise only one gas, in which case the output is at the wavelength characteristic of that excimer gas. For example, referring to Table I, the XeCl gas produces an output at 308 nm and this output provides a good match to several photoresists, such as Shipley AZ 2400, for example. The KrF gas produces an output at 249 nm which is suitable for exposing photoresists comprising a novolak resin sensitized with a diazo ketone, such as Shipley AZ 2400 and Meldrums diazo photoresists. The KrCl gas produces an output at 222 nm which provides an output appropriate for materials such as the spectral characteristics of poly (methyl methacrylate)

(PMMA) and poly (methyl isopropenyl ketone) (PMIPK) photoresists. The selection of two or more gases and the production of a mixture of the selected gases within the laser chamber provide outputs at each of the wavelengths associated with the selected gases.

The use of multiple wavelengths for exposure helps to minimize the often encountered problem of standing waves in the photoresist which result from the interference between the incident exposure radiation and that reflected from the interfaces between the photosensitive medium, the substrate, and the different underlying layers that may be present. The multiple wavelength exposure helps to average any standing waves present so that higher resolution patterns are produced.

Figure 6:
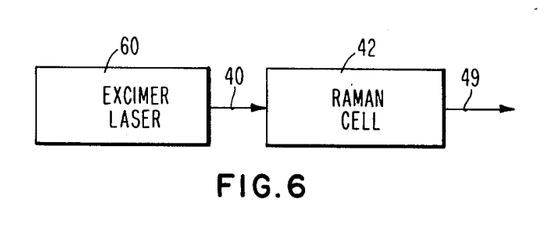
FIG. 6 is a diagrammatic view of a second embodiment of the light source for the systems of FIGS. 1, 2 and 3.

To further optimize the exposure, one or more additional wavelengths can be produced by stimulated Raman scattering which can be used to produce one or more wavelength outputs anywhere within a desired spectral region. One embodiment of a light source which produces a plurality of different wavelength outputs is shown in FIG. 6. The light source comprises excimer laser means 60 which produces an output beam 40 having at least one wavelength which is determined by the excimer gas selected for excimer laser means 60. To produce stimulated Raman scattering, the output beam 40 from the excimer laser means 60 (FIG. 6) is directed through suitable focusing optical means 41 (FIG. 8) to Raman cell 42. At least one secondary wavelength is produced in the output beam 49 from Raman cell 42 which is directed to expose the photosensitive medium. One embodiment of a Raman cell 42 (FIG. 8) comprises a tubular member 45 which is closed at each end by a window member 43, 44 to form an enclosure which is filled with a suitable gaseous medium.

The Raman cell utilizes the Raman effect, the inelastic scattering process of photons by excitations in matter. In particular, spontaneous Raman scattering is the process by which the radiation incident on a material experiences a frequency shift due to inelastic scattering from certain characteristic excitations, e.g., molecular vibrations of the medium. When the incident power is made large enough, this frequency-shifted scattered radiation can be stimulated. Whereas the conversion yield in the spontaneous Raman effect is typically $\sim 10^{-7}$, it can be as large as 70% in the stimulated case. Thus, intense coherent light can be produced at different wavelengths by stimulated Raman scattering. The scattered wavelengths can be both up (Strokes)- and down (anti-Strokes)-shifted from the incident laser wavelength by multiples of a molecular vibration (or other elementary excitation) characteristic of the Raman medium. Since very high peak powers are available from excimer lasers, they are ideally suited for stimulated Raman shifting. Thus, each of the wavelengths listed in Table I can be shifted to several new wavelengths by selecting different Raman media. As an example, a wide variety of wavelengths can be produced from the lasers listed in Table I by stimulated Raman scattering in $H_2$, $D_2$, $CH_4$ and liquid nitrogen. A representative group of the wavelengths that can be produced by stimulated Raman scattering is shown in Table II.

TABLE II

Wavelengths Available by Various Excimer Lasers and Stimulated Raman Scattering

| Ex-cimer | Raman Medium | Wavelength (nm) | | | | | |
|---|---|---|---|---|---|---|---|
| | | Second Anti-Stokes | First Anti-Stokes | Primary | First Stokes | Second Stokes | Third Stokes |
| ArF | $H_2$ | 166 | 179 | 193 | 210 | 230 | 254 |
| ArF | $D_2$ | 173 | 182 | 193 | 205 | 218 | 233 |
| KrCl | $H_2$ | 187 | 203 | 222 | 245 | 272 | 307 |
| KrCl | $D_2$ | 196 | 208 | 222 | 238 | 256 | 277 |
| KrF | $H_2$ | 206 | 226 | 249 | 278 | 314 | 361 |
| KrF | $CH_4$ | 217 | 232 | 249 | 268 | 291 | 318 |
| XeCl | $O_2$ | 281 | 294 | 308 | 323 | 341 | 360 |
| XeCl | $D_2$ | 260 | 282 | 308 | 339 | 378 | 426 |

Figure 8:
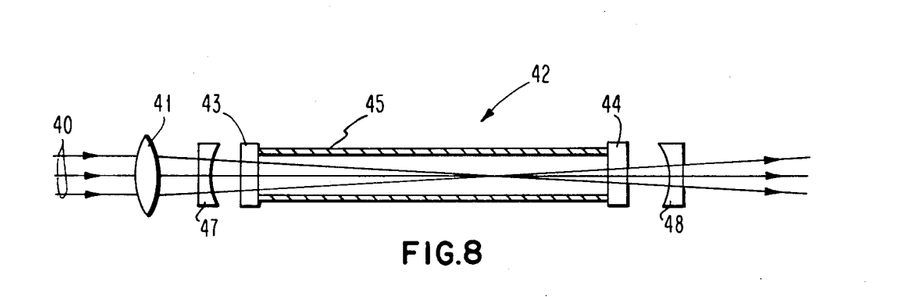
FIG. 8 is a cross-section view of a Raman cell forming a part of an alternate embodiment of the light source for the systems of FIGS. 1, 2, and 3.

The distribution of the incident laser pulse energy into various modes can be tailored by adjusting the gas pressure within the Raman cell and/or the optics, such as focusing optics 41. To provide additional control over the distribution of power into various modes, dichroic mirrors 47, 48 can be used.

A further variation of the secondary wavelengths available for exposure of a photosensitive element can be produced by including two separate Raman media with the Raman cell. As an example, referring to Table II, the excimer KrCl is selected and both $H_2$ and $D_2$ are included in the Raman cell. In this case, it is possible to get all of the wavelengths listed in Table II for the KrCl excimer and for each of the Raman media $H_2$ and $D_2$, and additional wavelengths due to Raman shifting of the secondary radiation. It can be seen that it is possible to obtain a large number of wavelengths in the output from the Raman cell in this example. The advantages in utilizing multiple wavelengths in producing higher resolution patterns has been discussed above.

Figure 11:
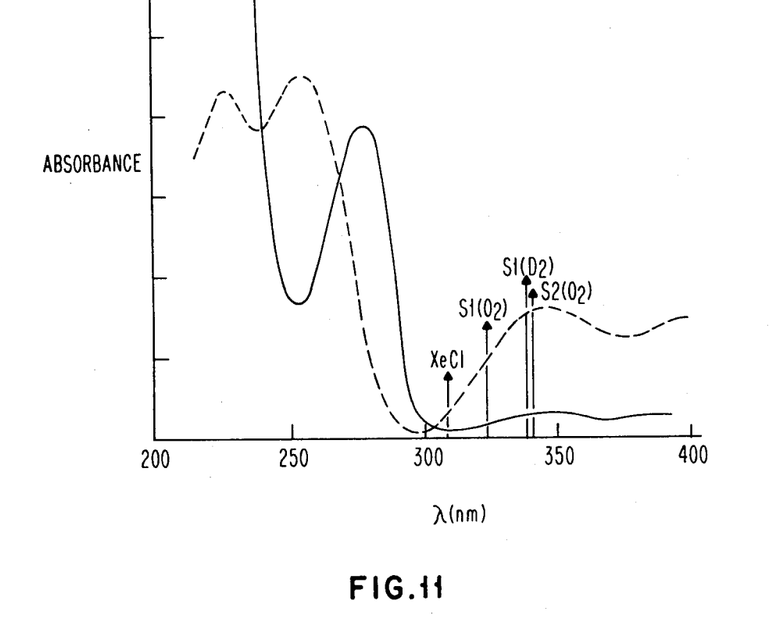
FIG. 11 is a plot showing the UV spectra of a photosensitive material comprising diazonaphthoquinone sensitizer and novolak resin.

To better illustrate the flexibility in operation in an optical lithography system, a specific example will be given with reference to FIG. 11. Shown in FIG. 11 are the UV spectra of a photoresist material comprising a diazonaphthoquinone sensitizer (broken line spectrum) and a novolak resin (full line spectrum). This material is ideally suited for exposure by the 365 nm or the 405 nm line of a mercury arc lamp. Referring to Table I, suppose a XeCl laser is available, which produces a fundamental output at 308 nm. Referring to FIG. 11, note that the sensitizer does have absorbance at 308 nm, albeit small compared to the absorbance at slightly longer wavelengths. However, due to the much higher power output of the XeCl excimer laser, the latter may be usable alone as an exposure source for this photoresist with reasonable exposure time. But now, consider the improvement possible by stimulated Raman scattering utilizing deuterium as the Raman medium. This operation produces a secondary output at about 340 nm which is near the peak of the sensitizer absorbance. Clearly, this exposure with both the fundamental and one secondary wavelength at almost the peak absorbance would be far superior to an exposure at the much lower power mercury-arc emission line for which the photoresist was designed. As an alternative, a second example is given in FIG. 11 of stimulated Raman scattering in which the Raman medium is oxygen ($O_2$). Note that in this case, a first secondary wavelength is produced at about 323 nm and a second secondary wavelength is produced at about 340 nm at almost the peak intensity.

These examples show how the selection of the excimer gas which defines the primary wavelength(s) and the selection of the Raman medium along with other conditions which define the secondary wavelength(s) can be utilized to produce an optimized exposure for a photosensitive medium with known spectral characteristics.

While the invention has been particularly shown and described with reference to preferred embodiments thereof, it will be understood by those skilled in the art that various other changes in the form and details may be made therein without departing from the spirit and scope of the invention.

Having thus described our invention, what we claim as new and desire to secure by Letters Patent is:

1. The method for exposing, in a contact or projection mode, an area of a photosensitive element to the output of a light source at a predetermined wavelength to produce a pattern, characterized in that said method comprises the steps of providing a fundamental output from a light source comprising a pulsed incoherent excimer laser; and directing the output of said excimer laser to uniformly expose said photosensitive element over the area of said pattern.

2. The method of claim 1 further comprising the step of producing a plurality of fundamental outputs from said pulsed incoherent excimer laser, each of said fundamental outputs having a predetermined different wavelength.

3. The method of claim 1, further comprising the steps of interposing a Raman cell between the pulsed incoherent excimer laser and photosensitive element; and producing at least one secondary wavelength by stimulated Raman scattering in at least one suitable Raman medium contained in said Raman Cell, there being at least one such secondary wavelength corresponding to each Raman medium contained in said Raman cell.

4. The method of claim 3, further comprising the step of producing a plurality of secondary wavelengths by Raman scattering, each of said secondary wavelengths having a different predetermined wavelength.

5. The method of claim 3 further comprising the steps of filling said Raman cell with a plurality of suitable Raman media, and producing a plurality of secondary wavelengths by Raman scattering, one of said secondary wavelengths corresponding to each of the Raman media contained in the Raman cell.

6. The method of claim 3 further comprising the steps of producing a plurality of fundamental outputs from said pulsed incoherent excimer laser, each of said fundamental outputs having a predetermined different wavelength, and producing a plurality of secondary wavelengths from said Raman cell, there being at least one such secondary wavelength corresponding to each of the fundamental outputs.

7. The method of claim 6, further comprising the step of filling said Raman cell with a plurality of suitable Raman media, and producing a plurality of secondary wavelengths by Raman scattering, there being at least one such secondary wavelength corresponding to each of the Raman media contained in the Raman cell.

8. The method for exposing, in a contact or projection mode, an area of a photosensitive element having a known wavelength sensitivity to produce a pattern comprising the steps of:
providing a pulsed incoherent excimer laser;
selecting an excimer medium for said excimer laser which produces a fundamental output of a predetermined wavelength;
providing a Raman cell;
selecting a suitable Raman medium for said Raman cell;
directing the output of said pulsed incoherent excimer laser to said Raman cell to produce at least one secondary wavelength within said known wavelength sensitivity region by stimulated Raman scattering in said suitable medium contained in said Raman cell; and
uniformly exposing over the area of said pattern, said photosensitive element to the output of said Raman cell to optimize exposure for said known sensitivity region.

9. Apparatus for exposing, in a contact or projection mode, an area of a photosensitive element to produce a pattern comprising:
a pulsed incoherent excimer laser operable to produce a fundamental output of a predetermined wavelength; and
means for directing the output of said excimer laser to uniformly expose, over the area of said pattern, said photosensitive element to the output at said predetermined wavelength to produce said pattern.

10. The apparatus of claim 9 wherein said pulsed incoherent excimer laser includes a rare gas halide lasing medium.

11. The apparatus of claim 10 wherein said rare gas halide lasing medium is chosen from the group consisting of XeCl, KrF, KrCl and XeF.

12. The apparatus of claim 9 wherein said photosensitive element is chosen from the group consisting of novolak resin sensitized with a diazo ketone, poly(methyl methacrylate), and poly (methyl isopropenyl ketone).

13. The apparatus of claim 12 wherein said pulsed incoherent excimer laser includes a rare gas halide lasing medium.

14. The apparatus of claim 13 wherein said rare gas halide lasing medium is chosen from the group consisting of XeCl, KrF, KrCl, and XeF.

15. Apparatus for exposing, in a contact or projection mode, an area of a photosensitive element to produce a pattern comprising:
pulsed incoherent excimer laser means for producing a plurality of fundamental outputs, each output having a predetermined wavelength different from the other predetermined wavelength; and
means for directing the output of said excimer laser for uniformly exposing, over the area of said pattern, said photosensitive element to the outputs at said plurality of predetermined wavelengths to produce said pattern.

16. The apparatus of claim 15 wherein said pulsed incoherent excimer laser includes a plurality of rare gas halide lasing media.

17. The apparatus of claim 16 wherein said plurality of rare gas halide lasing media are chosen from the group consisting of XeCl, KrF, KrCl and XeF.

18. The apparatus of claim 15 wherein said photosensitive element is chosen from the group consisting of novolak resin sensitized with a diazo ketone, poly(methyl methacrylate), and poly (methyl isopropenyl ketone).

19. The apparatus of claim 18 wherein said pulsed incoherent excimer laser includes a plurality of rare gas halide lasing media.

20. The apparatus of claim 19 wherein said plurality of rare gas halide lasing media are chosen from the group consisting of XeCl, KrF, KrCl, and XeF.

21. Apparatus for exposing, in a contact or projection mode, an area of a photosensitive element to produce a pattern comprising:
- a pulsed incoherent excimer laser operable to produce a fundamental output of a predetermined wavelength;
- a Raman cell having a suitable Raman medium contained therein;
- means for directing said excimer laser output to said Raman cell to produce a secondary wavelength by stimulated Raman scattering in said suitable medium; and
- means for directing the output from said Raman cell to uniformly expose, over the area of said pattern, said photosensitive element to produce said pattern.

22. The apparatus of claim 21 wherein said pulsed incoherent excimer laser includes a rare gas halide lasing medium.

23. The apparatus of claim 22 wherein said rare gas halide lasing medium is chosen from the group consisting of XeCl, KrF, KrCl and XeF.

24. The apparatus of claim 21 wherein said photosensitive element is chosen from the group consisting of novolak resin sensitized with a diazo ketone, poly(methyl methacrylate), and poly (methyl isopropenyl ketone).

25. The apparatus of claim 24 wherein said pulsed incoherent excimer laser includes a rare gas halide lasing medium.

26. The apparatus of claim 25 wherein said rare gas halide lasing medium is chosen from the group consisting of XeCl, KrF, KrCl, and XeF.

27. Apparatus for exposing, in a contact or projection mode, an area of a photosensitive element to produce a pattern comprising:
- a pulsed incoherent excimer laser operable to produce a fundamental output of a predetermined wavelength;
- a Raman cell having a suitable Raman medium contained therein;
- means for directing said excimer laser output to said Raman cell to produce a plurality of secondary wavelengths by stimulated Raman scattering in said suitable medium; and
- means for directing the outputs from said Raman cell to uniformly expose, over the area of said pattern, said photosensitive element to produce said pattern.

28. The apparatus of claim 27 wherein said pulsed incoherent excimer laser includes a rare gas halide lasing medium.

29. The apparatus of claim 28 wherein said rare gas halide lasing medium is chosen from the group consisting of XeCl, KrF, KrCl and XeF.

30. The apparatus of claim 27 wherein said photosensitive element is chosen from the group consisting of novolak resin sensitized with a diazo ketone, poly(methyl methacrylate), and poly (methyl isopropenyl ketone).

31. The apparatus of claim 30 wherein said pulsed incoherent excimer laser includes a rare gas halide lasing medium.

32. The apparatus of claim 31 wherein said rare gas halide lasing medium is chosen from the group consisting of XeCl, KrF, KrCl, and XeF.

33. Apparatus for exposing, in a contact or projection mode, an area of a photosensitive element to produce a pattern comprising:
- a pulsed incoherent excimer laser operable to produce a fundamental output of a predetermined wavelength;
- a Raman cell having a plurality of suitable Raman media contained therein;
- means for directing said excimer laser output to said Raman cell to produce a plurality of outputs of secondary wavelengths by stimulated Raman scattering in said plurality of suitable media; and
- means for directing the outputs from said Raman cell to uniformly expose, over the area of said pattern, said photosensitive element to produce said pattern.

34. The apparatus of claim 33 wherein said pulsed incoherent excimer laser includes a rare gas halide lasing medium.

35. The apparatus of claim 34 wherein said rare gas halide lasing medium is chosen from the group consisting of Xecl, KrF, KrCl and XeF.

36. The apparatus of claim 33 wherein said photosensitive element is chosen from the group consisting of novolak resin sensitized with a diazo ketone, poly(methyl methacrylate), and poly (methyl isopropenyl ketone).

37. The apparatus of claim 36 wherein said pulsed incoherent excimer laser includes a rare gas halide lasing medium.

38. The apparatus of claim 37 wherein said rare gas halide lasing medium is chosen from the group consisting of XeCl, KrF, KrCl, and XeF.

39. Apparatus for exposing, in a contact or projection mode, an area of a photosensitive element to produce a pattern comprising:
- a pulsed incoherent excimer laser operable to produce a plurality of fundamental outputs, each output having a predetermined wavelength different from the other predetermined wavelengths;
- a Raman cell having a suitable Raman medium contained therein;
- means for directing said excimer laser output to said Raman cell to produce an output of a secondary wavelength for each of said fundamental outputs by stimulated Raman scattering in said suitable medium; and
- means for directing the outputs from said Raman cell to uniformly expose, over the area of said pattern, said photosensitive element to produce said pattern.

40. The apparatus of claim 39 wherein said pulsed incoherent excimer laser includes a plurality of rare gas halide lasing media.

41. The apparatus of claim 40 wherein said plurality of rare gas halide lasing media are chosen from the group consisting of XeCl, KrF, KrCl and XeF.

42. The apparatus of claim 39 wherein said photosensitive element is chosen from the group consisting of novolak resin sensitized with a diazo ketone, poly(methyl methacrylate), and poly (methyl isopropenyl ketone).

43. The apparatus of claim 42 wherein said pulsed incoherent excimer laser includes a plurality of rare gas halide media.

44. The apparatus of claim 43 wherein said plurality of rare gas halide lasing media are chosen from the group consisting of XeCl, KrF, KrCl, and XeF.

45. Apparatus for exposing, in a contact or projection mode, an area of a photosensitive element to produce a pattern comprising:
- a pulsed incoherent excimer laser operable to produce a plurality of fundamental outputs, each output having a predetermined wavelength different from the other predetermined wavelengths;
- a Raman cell having a plurality of suitable Raman media contained therein;
- means for directing said plurality of fundamental outputs to said Raman cell to produce a plurality of secondary wavelengths for each of said fundamental outputs by stimulated Raman scattering in said plurality of suitable media; and
- means for directing the outputs from said Raman cell to uniformly expose, over the area of said pattern, said photosensitive element to produce said pattern.

46. The apparatus of claim 45 wherein said pulsed incoherent excimer laser includes a plurality of rare gas halide lasing media.

47. The apparatus of claim 46 wherein said plurality of rare gas halide lasing media are chosen from the group consisting of XeCl, KrF, KrCl and XeF.

48. The apparatus of claim 45 wherein said photosensitive element is chosen from the group consisting of novolak resin sensitized with a diazo ketone, poly(methyl methacrylate), and poly (methyl isopropenyl ketone).

49. The apparatus of claim 48 wherein said pulsed incoherent excimer laser includes a plurality of rare gas halide lasing media.

50. The apparatus of claim 49 wherein said plurality of rare gas halide lasing media are chosen from the group consisting of XeCl, KrF, KrCl, and XeF.

* * * * *